United States Patent
Zejda et al.

[19]

[11] Patent Number: 5,803,521
[45] Date of Patent: Sep. 8, 1998

[54] APPARATUS FOR GRIPPING A FLAT SUBSTRATE

[75] Inventors: Jaroslav Zejda, Rodenbach; Stefan Kempf, Alzenau, both of Germany

[73] Assignee: Balzers und Leybold Deutschland Holding AG, Hanau, Germany

[21] Appl. No.: 692,536

[22] Filed: Aug. 6, 1996

[30] Foreign Application Priority Data

Aug. 11, 1995 [DE] Germany .......................... 195 29 537.4

[51] Int. Cl.⁶ .................................................. B25J 15/10
[52] U.S. Cl. ................................ 294/97; 294/88; 294/116
[58] Field of Search ................................. 294/93–95, 97, 294/99.1, 100, 115, 116, 88, 86.24, 86.25; 901/37, 39

[56] References Cited

U.S. PATENT DOCUMENTS

| | | | |
|---|---|---|---|
| 3,108,835 | 10/1963 | Rowekamp | 294/116 |
| 3,384,048 | 5/1968 | Kutcher | 118/2 |
| 4,093,081 | 6/1978 | Yver | 214/1 BB |
| 4,726,615 | 2/1988 | Goldberg | 294/116 |
| 5,000,651 | 3/1991 | Akagawa et al. | 294/93 |
| 5,503,446 | 4/1996 | De Jong | 294/100 |

FOREIGN PATENT DOCUMENTS

| | | |
|---|---|---|
| 2657992 | 11/1983 | Germany . |
| 9307263.5 | 9/1993 | Germany . |
| 9043-792 | 3/1984 | Japan ........................................ 294/95 |

OTHER PUBLICATIONS

Abele, "Industrieroboter in der Montage" Technische Rundschau 26/85, S. 26, 28–31, 33, 1985.

*Primary Examiner*—Dean Kramer
*Attorney, Agent, or Firm*—Felfe & Lynch

[57] ABSTRACT

A plurality of finger-like grippers (12, 13, 14) pivotably supported in a housing (4, 5), and a plunger or piston (7) with a head part (8a) acting on the grippers (12, 13, 4), the piston being supported in such a way that it is free to slide in the housing (4). The grippers are held and guided in openings (17, 18) in the top part (5) of the housing (4) and can pivot about axes transverse to the longitudinal axis (L) of the housing (4, 5), where the pivot axes (a, b, c) of all the grippers are in the same plane (e) and together form a regular polygon surrounding the longitudinal axis (L). The ends of the grippers (12, 13, 14) facing the piston (7) are surrounded as a group by a ring of elastic material or by a garter spring (15), which pulls them toward stop surfaces (4b), which limit the pivoting movement.

18 Claims, 2 Drawing Sheets

APPARATUS FOR GRIPPING A FLAT SUBSTRATE

BACKGROUND OF THE INVENTION

The invention pertains to an apparatus for gripping and holding a flat, preferably disk-shaped substrate with a central opening, such as a compact disc. The apparatus has several finger-like grippers supported in a housing so that they can tilt, and a plunger or piston, supported in the housing so that it can slide, with a head part on the piston to act on the grippers.

In vacuum processing technology, especially in thin-layer technology, the coating of circular disk-shaped substrates such as glass or aluminum disks for magnetic or magneto-optic data storage media is known. These disk-like substrates are widely used as storage media for digital information. A sputtering process, for example, is used to coat pressed plastic disks with layer of aluminum. The sputter coating systems used for this purpose usually have an automated handling device in and behind a vacuum chamber to transport the substrates.

A pivot arm of a handling system, for example, transports the substrates from a buffer into the vacuum chamber. In the chamber, the substrates are laid on a rotating table and moved together with it through the individual stations of the vacuum chamber. Numerous devices for gripping and holding are known according to the state of the art to load the substrates onto, and to unload them from, the rotating table.

The grippers usually used in the vacuum chambers of the current type are actuated from outside the chamber by means of a vacuum slide channels.

These known devices suffer from the disadvantage that they usually contain too many moving parts. As a result of the sliding movements in the slide channels, undesirable particles are produced, which later find their way into the coating space, where they have negative effects on the result of the coating operation. In addition, the seals of slide channels of this type usually show wear after a certain period of time, and this wear always results in leakage from the vacuum chamber and thus to expensive and time-consuming repair.

A device has already been proposed (G 93 07 263.5) for gripping and holding a flat, preferably disk-shaped substrate, consisting essentially of several grippers and a membrane of elastic material, which closes an opening provided in a pressure-tight housing. Different pressures can be produced in front of and behind the membrane, and the membrane is installed in such a way that, when the pressures are different, the membrane moves out of its rest position and, when the pressures on both sides are the same, the membrane is returned to its rest position again by a compression spring. One end of each gripper is connected mechanically to the membrane in such a way that the other, free end executes a pivoting motion proportional to the excursion of the membrane to grip and hold or to release the substrate.

SUMMARY OF THE INVENTION

The object of the present invention is to correct the disadvantages of the prior art, and to provide an inexpensive apparatus which makes it possible to grip and hold substrates inside and outside vacuum chambers in an especially quick and reliable manner.

According to the invention the grippers are held and guided in holes in the top part of the housing and are able to pivot about axes transverse to the longitudinal axis of the housing, the pivot axes of all the grippers being on the same plane, these axes forming together a regular polygon surrounding the longitudinal axis. The ends of the grippers facing the piston are surrounded as a group by a ring of elastic material or by a garter spring, which pulls them against stop surfaces to limit the pivoting movement.

With the apparatus according to the invention the substrates can be advantageously gripped and held inside and outside of vacuum chambers, the movements being carried out with practically no friction. In addition, the present invention makes it possible for the apparatus to operate with a maximum of speed and reliability.

DETAILED DESCRIPTION OF THE PREFERRED EMBODIMENT

Figure 1:
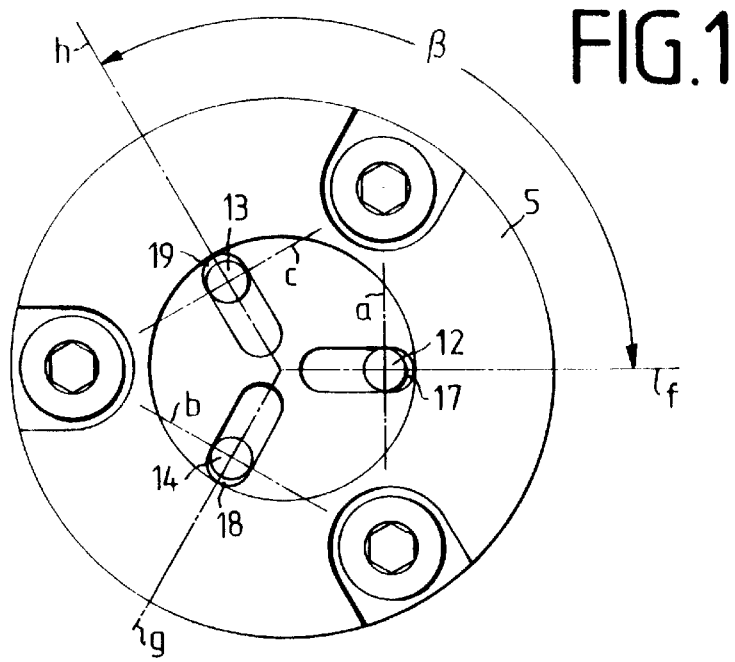
FIG. 1 is a plan view of the gripping mechanism.

The apparatus for gripping and holding substrate 3 includes a cylindrical housing 4 with a top part 5; a piston 7 with a mushroom-shaped pusher 8, which can slide longitudinally in a blind hole 6 in housing 5; a cover 9 to seal off the top of blind hole 6, this cover being provided with a connecting hole 10 to allow access to the pressure medium; a spring ring 11 to hold cover 9 in position; three finger-like grippers 12, 13, 14; an elastic ring or band or a worm spring 15 surrounding all three grippers 12, 13, 14; and three bearing rings 16, each one surrounding one of the grippers 12, 13, 14.

As the drawing shows, each of the three grippers 12, 13, 14 is installed in one of shaft-like holes 17, 18, 19, which consist of three similar openings in bottom part 4a of housing 4 and three similar recesses in bottom part 5a of top part 5. These openings are designed in such a way that each of the three grippers 12, 13, 14 can be tipped from a vertical position (as shown) into a slightly tilted position (as indicated in broken line) by an angle a of approximately 10°. Each of grippers 12, 13, 14 tips on its bearing ring 16 around a horizontal axis a or b or c, the bearing ring being held on one side in a ring-shaped groove in the gripper and on the other side in ring-shaped grooves in housing parts 4, 5.

At the upper end of each gripper 12, 13, 14 there is a ring-shaped groove 20, 21, 22, in which the garter spring or elastic band 15 engages to urge grippers 12, 13, 14 against the central cylindrical stop surface 4b in the bottom part 4a.

When pressure medium now passes through connection 10 and enters space 23, it pushes piston 7 downward, and mushroom-shaped head part 8a thus pushes against the upper ends or heads of grippers 12, 13, 14, spreading them apart radially and tilting the shafts. As a result, the lower ends of the grippers pivot radially inward to such an extent that the grippers, i.e., the ring-shaped recesses or notches 24, 25, . . . . provided at their bottom ends, are released from central opening 26 in substrate 3. Substrate 3 therefore falls away. As soon as the pressure in space 23 is reduced, piston 7 with its mushroom-shaped end 8a moves back up again under the force of compression spring 27, and grippers 12, 13, 14 pivot back again into their original position, in which their longitudinal axes are parallel to each other and parallel to axis L.

Figure 2:
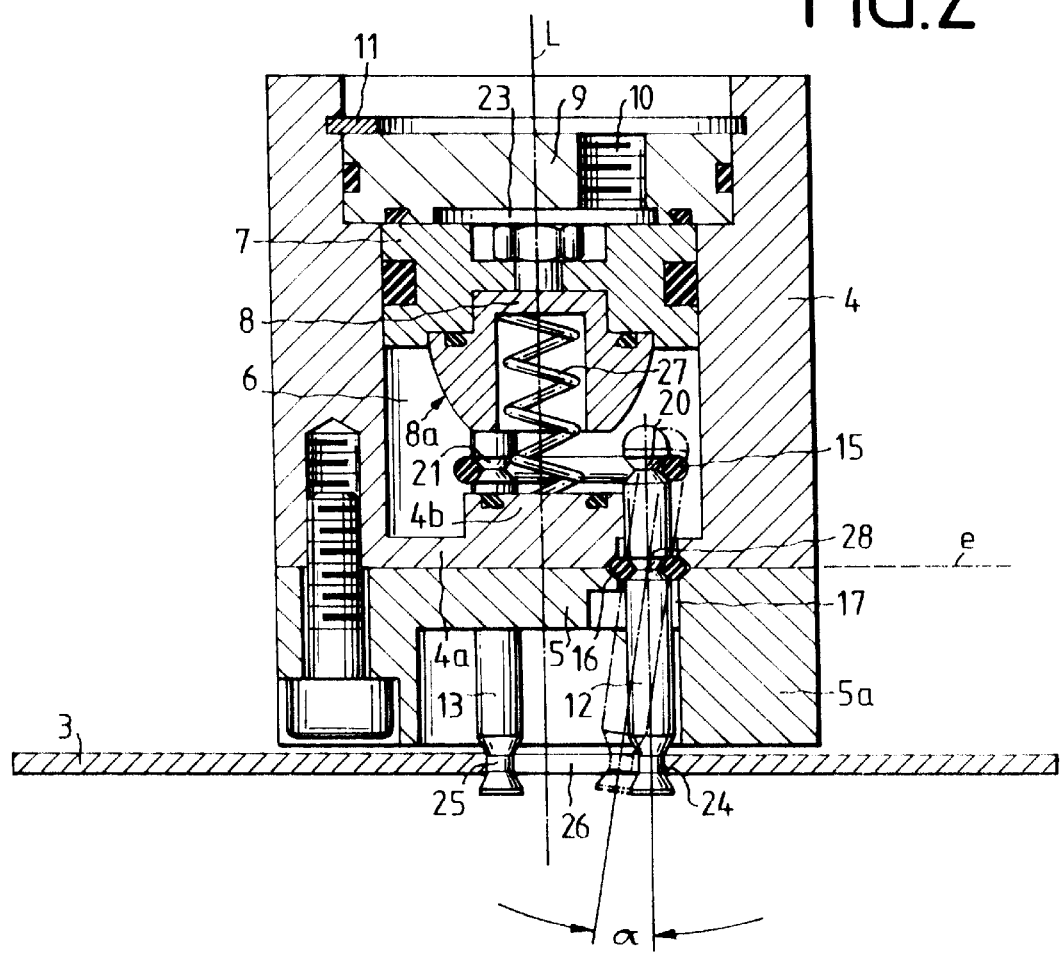
FIG. 2 is an axial cross section of the gripping mechanism.
Figure 3:
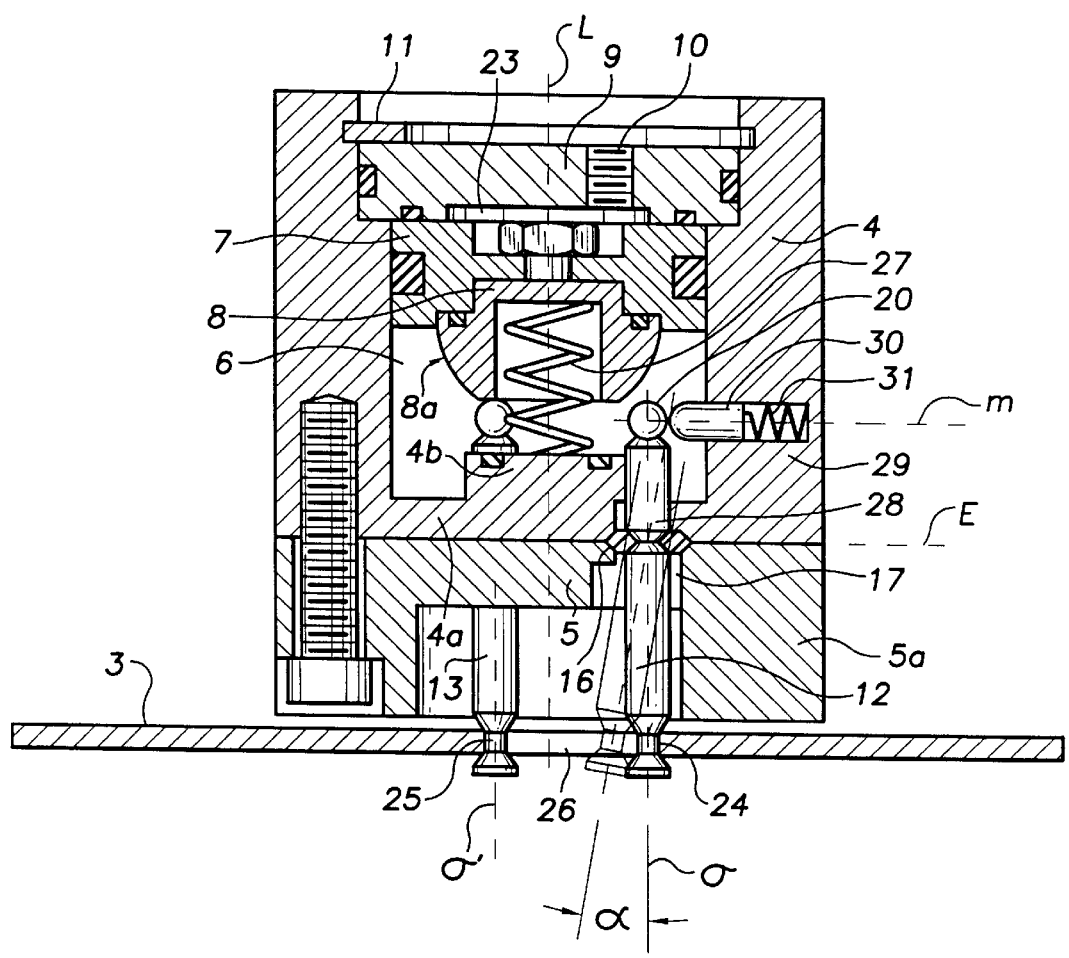
FIG. 3 is an axial cross section of an alternative embodiment.

In the alternative embodiment of FIG. 3 the elastic band or garter spring of FIG. 2 has been eliminated. Here the housing is provided with radially oriented blind bores 29 which open in the cavity 6. Thrust pieces 30 are slidably received in respective bores 29 and urged inward against the inner ends of respective grippers 12, 13, 14, in order to return the grippers to a vertical position when the pusher 8 retreats.

What is claimed is:

1. Apparatus for gripping a disk-like substrate having a central opening, said apparatus comprising:

a housing having a cavity, a longitudinal axis extending through said cavity, and stop surfaces in said cavity which face outward from said longitudinal axis, said housing having therein passages communicating with said cavity and a space outside said housing;

a plurality of finger-like grippers, each gripper being supported by a bearing means in said housing to generally pivot about pivot axes in a common plane which is transverse to said longitudinal axis, each gripper having an inner end in said cavity and a middle portion extending through a respective passage from said housing into said outside space, each of said grippers having an outer end in said space, said bearing means sealing said passages so that said cavity is isolated from the space outside said housing;

elastic means urging said inner ends toward said stop surfaces; and piston means supported in said housing for movement along said longitudinal axis, said piston means having a head which moves between said inner ends so as to urge said inner ends radially outward from said stop surfaces and to cause said grippers to pivot about said pivot axes so that said outer ends move radially inward.

2. Apparatus as in claim 1 wherein said elastic means is an elastic band around said inner ends.

3. Apparatus as in claim 1 wherein said elastic means is a garter spring around said inner ends.

4. Apparatus as in claim 1 wherein said housing has oval slots which accommodate said grippers so that said outer ends can move radially inward.

5. Apparatus as in claim 4 wherein each pair of adjacent slots is spaced apart by the same angle.

6. Apparatus as in claim 1 further comprising means for applying pressure to move said piston means along said axis toward said inner ends, and spring means urging said piston away from said inner ends.

7. The apparatus according to claim 1, wherein said bearing means each comprises an elastic ring surrounding the middle portion of the associated gripper.

8. The apparatus according to claim 7, and said housing providing a retaining recess in each of said passages and each of said grippers having a notch therein, the associated elastic ring being sealingly retained in said recess and notch.

9. The apparatus according to claim 8, wherein the notch has a shape selected from the group consisting of oval, semicircle, and triangle.

10. The apparatus according to claim 8 and said rings supporting said grippers for said generally pivoting movement by elastic deformation of said rings.

11. The apparatus according to claim 7 and said rings supporting said grippers for said generally pivoting movement by elastic deformation of said rings.

12. The apparatus according to claim 1, and the outer end of each gripper having a recess therein configured to receive therein the substrate, whereby the grippers grip said substrate.

13. The apparatus according to claim 1 wherein the outer ends of the grippers each have a generally cylindrical portion engaging the substrate in the opening and a generally conical shaped portion connected with the said cylindrical portion and retaining the substrate against movement away from the housing.

14. The apparatus according to claim 1 and said elastic means comprising a ring of elastic material surrounding said inner ends of the grippers.

15. Apparatus for gripping a disk-like substrate having a central opening, said apparatus comprising:

a housing having a cavity, a longitudinal axis extending through said cavity, and stop surfaces in said cavity which face outward from said longitudinal axis;

a plurality of finger-like grippers pivotably supported in said housing to pivot about pivot axes in a common plane which is transverse to said longitudinal axis, each gripper having an inner end in said cavity and an outer end protruding from said housing;

elastic means urging said inner ends toward said stop surfaces;

piston means supported in said housing for movement along said longitudinal axis, said piston means having a head which moves between said inner ends to urge said inner ends radially outward from said stop surfaces, thereby pivoting said grippers about said pivot axes so that said outer ends move radially inward; and wherein each gripper has an annular groove in the common plane of the pivot axes, said apparatus further comprising a plurality of elastic rings fitted in respective grooves, said rings deforming to assist pivoting of said grippers about said axes.

16. Apparatus for gripping a disk-like substrate having a central opening, said apparatus comprising:

a housing having a cavity, a longitudinal axis extending through said cavity, and stop surfaces in said cavity which face outward from said longitudinal axis;

a plurality of finger-like grippers pivotably supported in said housing to pivot about pivot axes in a common plane which is transverse to said longitudinal axis, each gripper having an inner end in said cavity and an outer end protruding from said housing;

elastic means urging said inner ends toward said stop surfaces;

piston means supported in said housing for movement along said longitudinal axis, said piston means having a head which moves between said inner ends to urge said inner ends radially outward from said stop surfaces, thereby pivoting said grippers about said pivot axes so that said outer ends move radially inward; and wherein said housing has a plurality of radially oriented blind bores which open in said cavity, each said bore slidably receiving a thrust piece which is aligned with the inner end of a respective gripper, said elastic means comprising a spring in each bore which urges a respective thrust piece radially inward against said inner end of a respective gripper.

17. Apparatus for gripping a disk-like substrate having an inner edge defining a central opening, said apparatus comprising:

a housing having a cavity therein, said housing having a longitudinal axis extending through said cavity, and said housing having stop surfaces in said cavity facing outward from said longitudinal axis;

a plurality of finger-like grippers supported in said housing to move generally pivotally about axes in a common plane transverse to said longitudinal axis, each gripper having an inner end in said cavity and an outer end protruding from said housing;

piston means supported in said housing for movement along said longitudinal axis, said piston means having a head which, when moved between said inner ends, urges said inner ends radially outward from said stop surfaces, thereby moving said grippers about said axes so that said outer ends move radially inward; and said outer ends of said grippers each having a substrate securing end portion extending generally radially outward of the longitudinal axis and defining in each of said grippers a respective recess disposed radially outward of the longitudinal axis of the housing, said recesses being configured so as to receive therein the inner edge of the substrate; and elastic means biasing said inner ends of the grippers toward said stop surfaces and, by the generally pivoting movement of said grippers, biasing said outer ends of the grippers to move radially outward so that, when the outer ends are placed in the central opening of the substrate and the piston means is withdrawn, the inner edge of the substrate is gripped and retained in said recesses.

18. The apparatus according to claim 17, and said substrate securing outer end portions being shaped as generally conically shaped flared structures.

* * * * *